US008956920B2

United States Patent
Wu et al.

(10) Patent No.: US 8,956,920 B2
(45) Date of Patent: Feb. 17, 2015

(54) LEADFRAME FOR INTEGRATED CIRCUIT DIE PACKAGING IN A MOLDED PACKAGE AND A METHOD FOR PREPARING SUCH A LEADFRAME

(75) Inventors: Tsung Yi Wu, Kaohsiung (TW); Chyi Keh Chern, Kaosiung (TW); Tsung Wen Chang, Kaohsiung (TW)

(73) Assignee: NXP B.V., Eindhoven (NL)

( * ) Notice: Subject to any disclaimer, the term of this patent is extended or adjusted under 35 U.S.C. 154(b) by 319 days.

(21) Appl. No.: 13/486,357

(22) Filed: Jun. 1, 2012

(65) Prior Publication Data

US 2013/0319744 A1 Dec. 5, 2013

(51) Int. Cl.
*H01L 21/48* (2006.01)
*H01L 21/50* (2006.01)
*H01L 23/495* (2006.01)

(52) U.S. Cl.
CPC ...... *H01L 21/4842* (2013.01); *H01L 23/49548* (2013.01); *H01L 23/49503* (2013.01)
USPC .................. 438/123; 257/676; 257/E23.037

(58) Field of Classification Search
CPC ............. H01L 21/4842; H01L 23/49503; H01L 23/49548
USPC .......................... 438/123; 257/676, E23.037
See application file for complete search history.

(56) References Cited

U.S. PATENT DOCUMENTS

| | | | |
|---|---|---|---|
| 5,019,746 A | 5/1991 | Merg | |
| 5,041,902 A | 8/1991 | McShane | |
| 5,126,820 A * | 6/1992 | Brown | 257/420 |
| 5,554,569 A * | 9/1996 | Ganesan et al. | 29/827 |
| 6,091,134 A * | 7/2000 | Sakamoto et al. | 257/666 |
| 6,197,615 B1 * | 3/2001 | Song et al. | 438/111 |
| 6,294,100 B1 | 9/2001 | Fan et al. | |
| 6,294,409 B1 * | 9/2001 | Hou et al. | 438/123 |
| 6,420,779 B1 | 7/2002 | Sharma et al. | |
| 6,506,630 B2 * | 1/2003 | Mastboom et al. | 438/124 |
| 6,569,755 B2 * | 5/2003 | Yamada et al. | 438/617 |
| 6,670,222 B1 * | 12/2003 | Brodsky | 438/118 |
| 6,852,574 B1 | 2/2005 | Quah et al. | |
| 7,399,658 B2 | 7/2008 | Shim et al. | |
| 7,572,675 B2 | 8/2009 | Narasimalu et al. | |
| 7,795,710 B2 * | 9/2010 | Islam et al. | 257/666 |
| 7,820,480 B2 * | 10/2010 | Islam et al. | 438/107 |
| 2008/0308952 A1 | 12/2008 | Heng | |
| 2009/0057863 A1 | 3/2009 | Chow et al. | |
| 2009/0315159 A1 | 12/2009 | Abbott | |
| 2010/0052149 A1* | 3/2010 | Nose et al. | 257/692 |
| 2011/0227208 A1* | 9/2011 | Kim et al. | 257/676 |
| 2013/0319744 A1* | 12/2013 | Wu et al. | 174/261 |
| 2014/0001620 A1* | 1/2014 | Shimizu et al. | 257/676 |
| 2014/0159221 A1* | 6/2014 | Shimizu et al. | 257/676 |
| 2014/0291825 A1* | 10/2014 | Yoneyama et al. | 257/676 |

* cited by examiner

*Primary Examiner* — Mary Wilczewski

(57) ABSTRACT

Embodiments of a method for preparing a leadframe for integrated circuit (IC) die packaging in a molded package with an exposed die pad are disclosed. In one embodiment, a method involves producing a leadframe with a die pad, wherein the die pad has a top surface, a bottom surface, and a perimeter edge. The die pad is then planarized to flatten burrs that may exist at the perimeter edge of the die pad, wherein planarizing the die pad comprises embedding tool markings in the die pad at the perimeter edge of the die pad, the tool markings including a series of peaks and valleys that run parallel to the perimeter edge at all locations around the perimeter edge. Embodiments of a leadframe for IC die packaging in a molded package are also disclosed.

19 Claims, 10 Drawing Sheets

LEADFRAME FOR INTEGRATED CIRCUIT DIE PACKAGING IN A MOLDED PACKAGE AND A METHOD FOR PREPARING SUCH A LEADFRAME

BACKGROUND

There are many techniques used to package an integrated circuit (IC) die into a usable packaged IC device. Some techniques involve encapsulating the IC die between a mold compound and a die pad. Additionally, some mold-based packaging techniques incorporate an exposed die pad, or E-pad, in which one side of the die pad is not covered by the molding so that the die pad is exposed to the outside environment. A packaged IC device with an exposed die pad can be used to dissipate heat from the packaged IC device.

When packaging an IC device in a molded package with an exposed die pad, the molding process is susceptible to the molding compound bleeding out onto the die pad that is supposed to remain exposed to the outside environment and free of molding compound. Bled out molding compound, or "mold flash," as it is often referred to, can reduce the ability of the exposed die pad to dissipate heat.

SUMMARY

Embodiments of a method for preparing a leadframe for integrated circuit (IC) die packaging in a molded package with an exposed die pad are disclosed. In one embodiment, a method involves producing a leadframe with a die pad, wherein the die pad has a top surface, a bottom surface, and a perimeter edge. The die pad is then planarized to flatten burrs that may exist at the perimeter edge of the die pad, wherein planarizing the die pad comprises embedding tool markings in the die pad at the perimeter edge of the die pad, the tool markings including a series of peaks and valleys that run parallel to the perimeter edge at all locations around the perimeter edge.

Embodiments of a leadframe for IC die packaging in a molded package are also disclosed. In one embodiment, a leadframe includes a die pad having a top surface, a bottom surface, and a perimeter edge and conductive leads surrounding the die pad. The die pad includes tool markings in the die pad at the perimeter edge of the die pad and the tool markings have a series of peaks and valleys that run parallel to the perimeter edge at all locations around the perimeter edge.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
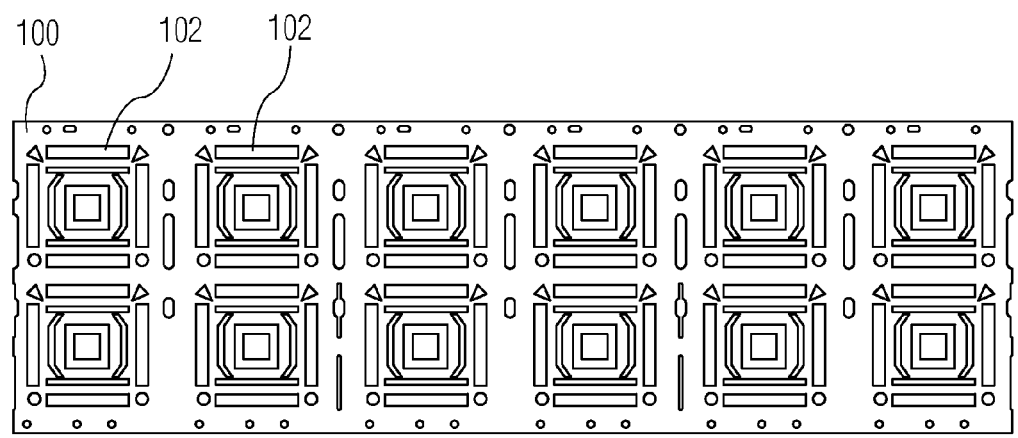
FIG. 1 depicts a leadframe strip that includes twelve leadframe modules.

FIG. 1 depicts a leadframe strip 100 that includes twelve leadframe modules 102. In an embodiment, the leadframe strip is made of a sheet of conductive material such as copper or a copper alloy. The leadframe modules include conductive leads and a die pad and the conductive leads are produced by stamping a pattern of leads into the conductive sheet. The die pad of each leadframe module may be produced from the same sheet of conductive material as the leads via the same stamping process. In another embodiment, the die pads are produced from a separate sheet of conductive material and attached in the center of the lead frame module by support bars. In general, techniques for producing leadframe strips with such leadframe modules are known in the field of IC packaging.

Figure 2:
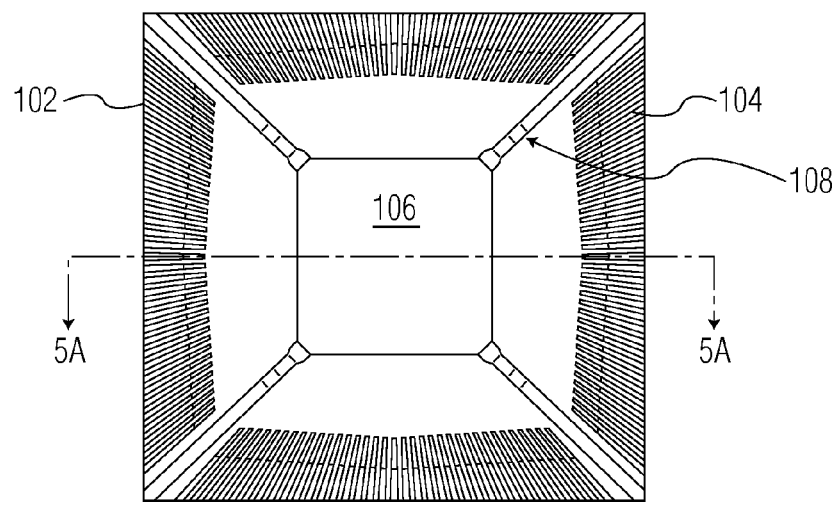
FIG. 2 depicts an expanded top view of one of the leadframe modules from FIG. 1.

FIG. 2 depicts an expanded top view of one of the leadframe modules 102 from FIG. 1. In particular, FIG. 2 depicts conductive leads 104, a die pad 106, and support bars 108 that fix the die pad to the rest of the leadframe module.

Figure 3:
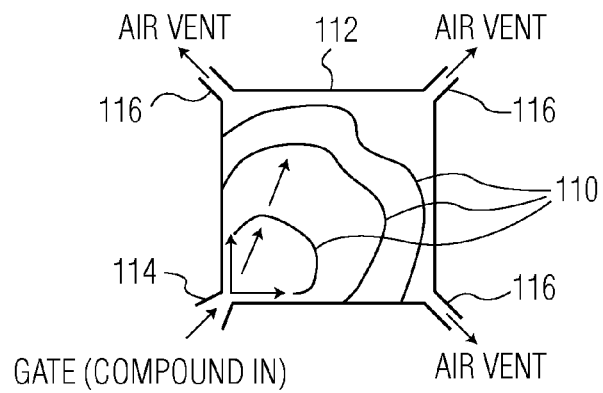
FIG. 3 illustrates the process of injecting a viscous molding compound into the desired area of a leadframe module.
Figure 4A:
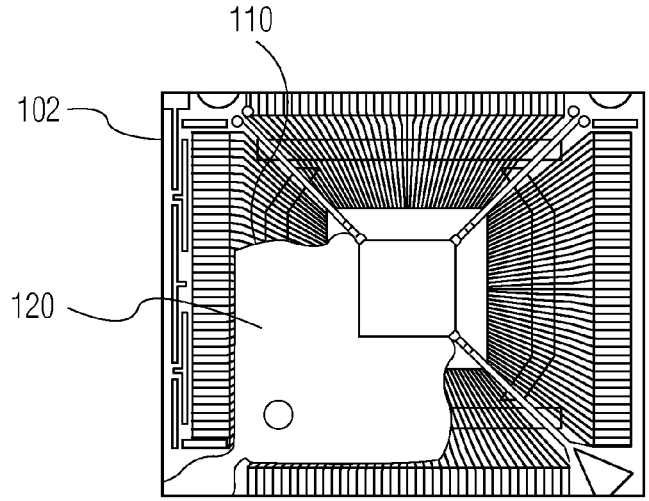
FIGS. 4A-4E are a chronological sequence of drawings that illustrate the flow of viscous molding compound into a leadframe module through a gate.
Figure 4B:
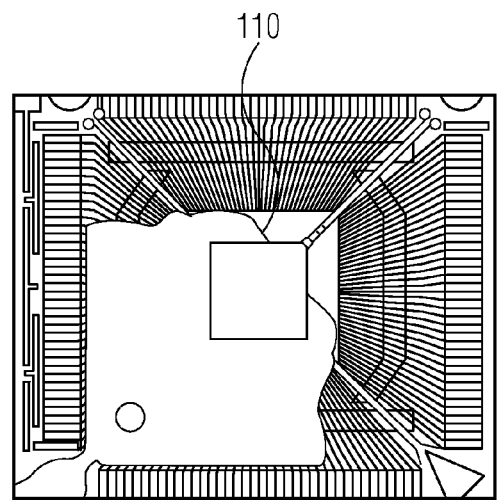
Figure 4C:
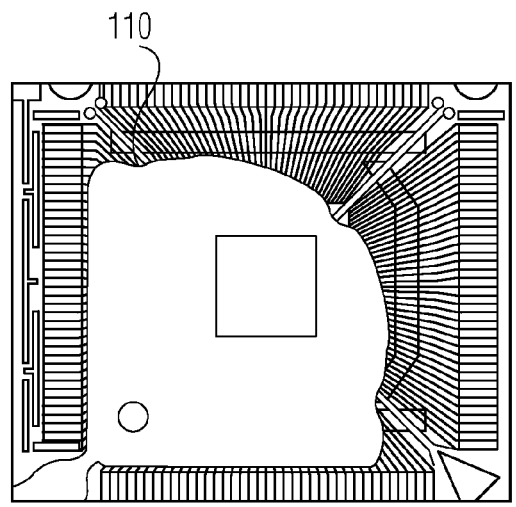
Figure 4D:
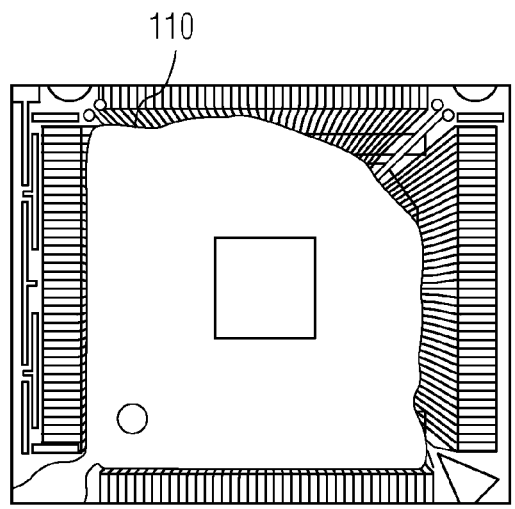
Figure 4E:
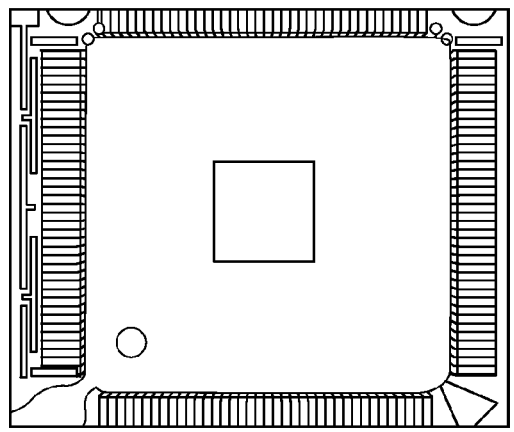

In a mold-based packaging process, once an IC die has been attached to the die pad 106, a molding compound is put into a viscous state, e.g., by the application of heat, and injected within a mold structure to encapsulate the IC die and a portion of the conductive leads while leaving the bottom surface of the die pad exposed to the surrounding environment. FIG. 3 illustrates the flow of a viscous molding compound (as indicated by flow lines 110) into the desired area of a leadframe module. In the embodiment of FIG. 3, a mold structure 112 includes a gate 114, through which the viscous molding compound is injected, and air vents 116, through which air escapes as the molding compound flows into the desired area of the leadframe module.

FIGS. 4A-4E are a chronological sequence of drawings that illustrate the flow of a viscous molding compound 120 into a leadframe module through a gate. In FIGS. 4A-4D, the viscous molding compound has not yet completely filled the desired area of the leadframe module 102 (as indicated by flow lines 110) and in FIG. 4E, the viscous molding compound has completely filled the desired area of the leadframe module. FIGS. 4A-4E illustrate the flow of molding compound from what is considered the back side, or bottom side, of the leadframe module. As shown in FIGS. 4A-4E, the bottom side of the die pad 106 remains free of the molding compound and exposed to the surrounding environment, thereby forming the exposed die pad, or E-pad.

Referring back to FIGS. 1 and 2, it is often the case that the die pads 106 are not completely planar in the leadframe strip 100. For example, die pads that are produced by stamping often have burrs at the edges. A burr can be a raised portion of the edge of the die pad that results from the tearing of the leadframe material in the stamping process, sometimes referred to as a "tear burr." Depending on how the die pad was stamped, or attached within, the leadframe module, burrs of the die pad may project upward, e.g., towards the front side or top side of the die pad or the burrs may project downward, e.g., towards the back side or bottom side of the die pad.

Figure 5A:
FIG. 5A depicts a side cutaway view of the die pad of FIG. 2 taken at section AA in the case where burrs project upward.
Figure 5B:
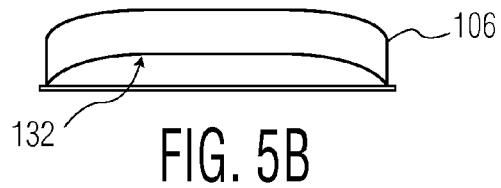
FIG. 5B depicts a side cutaway view of the die pad of FIG. 2 taken at section BB in the case where burrs project downward.

FIG. 5A depicts a side cutaway view of the die pad 106 of FIG. 2 taken at section 5A in the case where the burrs project upward, e.g., towards the front side or top side 130 of the die pad. FIG. 5B depicts a side cutaway view of the die pad of FIG. 2 taken at section 5A in the case where the burrs project downward, e.g., towards the back side or bottom side 132 of the die pad. FIGS. 5A and 5B depict the die pad relative to a flat portion of a mold structure, the significance of which is explained below.

Figure 6:
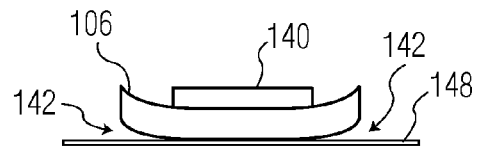
FIG. 6 depicts the side view of the die pad of FIG. 5A after an IC die has been attached to the die pad.

The process of packaging an IC die in a mold-based package using the leadframe modules 102 of FIGS. 1 and 2 is now described with reference to FIGS. 6 and 7. FIG. 6 depicts the side view of the die pad 106 of FIG. 5A after an IC die 140 has been attached to the die pad. As shown in FIG. 6, the upward projection of the burrs causes gaps to exist between the die pad in the mold structure. The gaps are identified in FIG. 6 at the highlighted locations 142. Although the other portions of the leadframe module are not shown for the sake of clarity, the other portions of the leadframe module, including the conductive leads and the support bars, are present at this stage.

Figure 7:
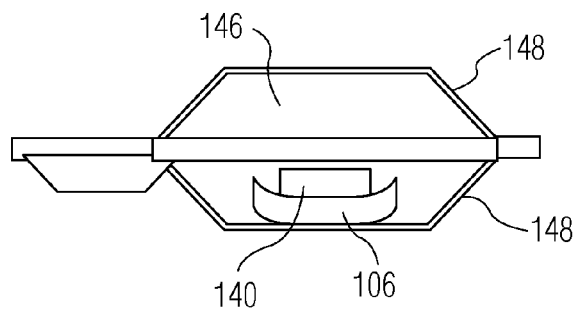
FIG. 7 depicts the die pad and IC die within a mold cavity that is formed by a mold structure.
Figure 8:
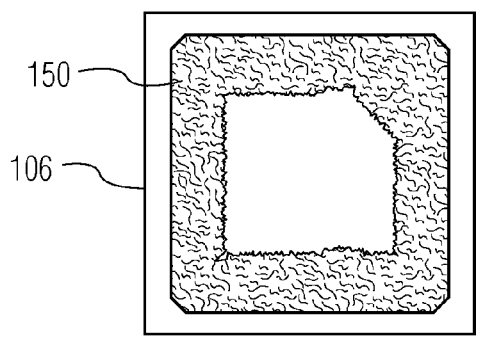
FIG. 8 depicts the back side of an exposed die pad after a molding process in the case where mold flash has formed on the surface of the exposed die pad.

FIG. 7 depicts the die pad 106 and IC die 140 within a mold cavity 146 that is formed by a mold structure 148. Once in the mold cavity, viscous molding compound is injected into the mold cavity to encapsulate the IC die and portions of the lead frame module as depicted in FIGS. 4A-4E. Although it is desired that the molding compound 120 does not bleed onto the bottom surface 132 of the die pad, the existence of the gap, which is caused by the burrs, allows some molding compound to bleed onto the bottom surface of the die pad. This mold bleeding leads to mold flash forming on the bottom surface of the die pad. FIG. 8 depicts the back side of an exposed die pad 106 after the molding process in the case where mold flash 150 has formed on the surface of the exposed die pad. In an exposed die pad or E-pad package, it is desirable to minimize the amount of mold flash that forms on the exposed die pad.

Figure 9A:
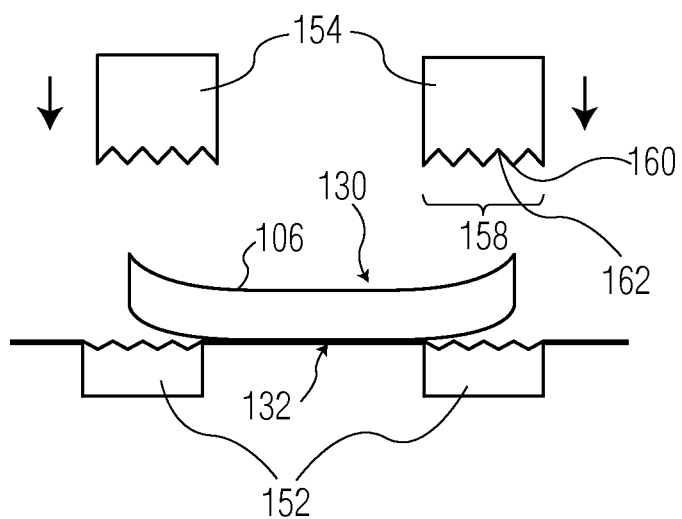
FIGS. 9A and 9B illustrate a planarization operation that can be applied to a die pad to eliminate burrs.
Figure 9B:
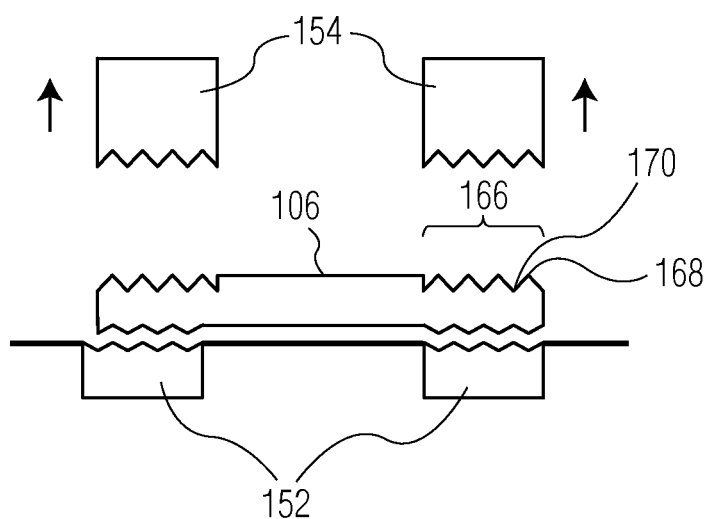

One technique that has been employed to reduce the formation of mold flash is a planarization process that aims to eliminate the burrs by flattening the upward and/or downward projections. In an embodiment, the planarization process, also referred to as "spanking," utilizes a die and a punch to flatten out the burrs. FIGS. 9A and 9B illustrate a planarization operation that can be applied to a die pad to eliminate burrs. In particular, FIGS. 9A and 9B depict spanking dies 152 and spanking punches 154 that are located at the perimeter edges of the die pad 106, with FIG. 9A depicting the die pad before spanking and FIG. 9B depicting the die pad after spanking. The spanking process itself involves applying a force to the spanking punches to drive the spanking punches down on top of the die pad and the respective spanking dies. The force of the spanking punches flattens the edges of the die pad and eliminates the burrs as shown in FIG. 9B. Additionally, as illustrated in FIGS. 9A and 9B, the spanking punches and the spanking dies include surface features 158, such as peaks 160 and valleys 162 that embed a corresponding pattern of tool markings or features 166 at the top surface 130 and the bottom surface 132 of the die pad. As shown in FIG. 9B, the features embedded at the top and bottom surfaces of the die pad are a series of peaks 168 and valleys 170.

Figure 10A:
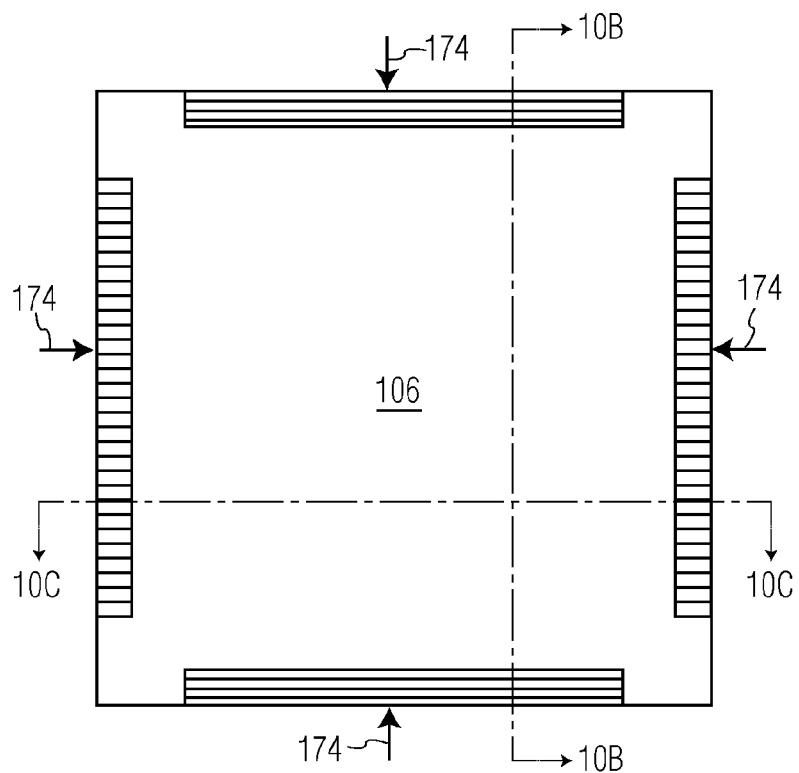
FIGS. 10A-10C depict top and side cutaway views of a die pad having tool markings in which peaks and valleys all run parallel to each other.
Figure 10B:
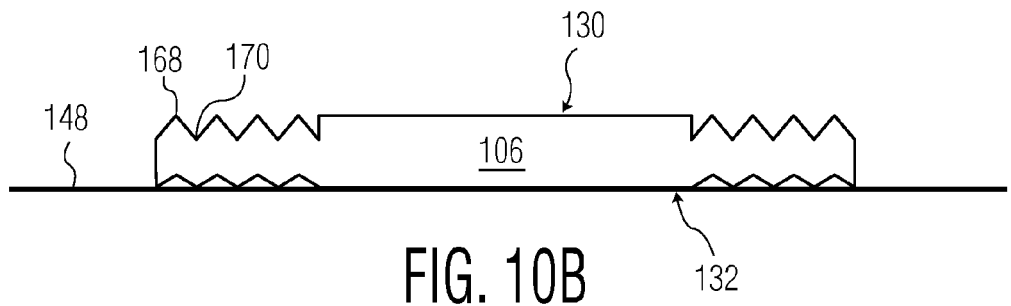
Figure 10C:
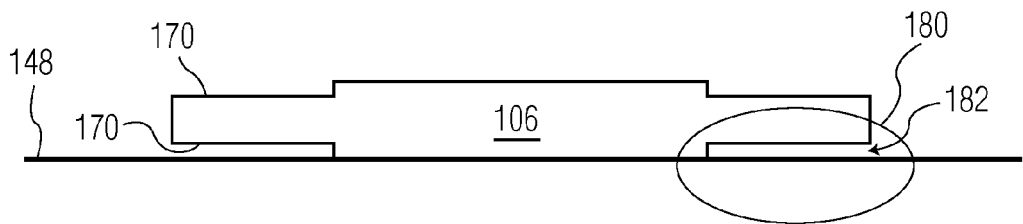

In a conventional spanking operation, a die tool, including the spanking dies 152 and the spanking punches 154, are configured so that the series of peaks 160 and valleys 162 all run parallel to each other. A die tool configured in such a manner will embed a corresponding series of peaks 168 and valleys 170 in the top and bottom surfaces of the die pad 106. A die pad spanked with a conventional configuration of the die tool is depicted in FIGS. 10A-10C. FIG. 10A is a top view of the of a die pad after spanking, which depicts all of the peaks and valleys of the tool markings 166 being parallel to each other. As shown in FIG. 10A, at the top and bottom edges of the die pad, the peaks and valleys run parallel to the corresponding perimeter edge and at the left and right edges of the die pad, the peaks and valleys run perpendicular to the corresponding perimeter edge. FIG. 10A also illustrates via arrows 174, which represent the direction at which molding compound could bleed between the die pad and a mold structure during a molding process.

FIG. 10B depicts a side cutaway view of the die pad 106 of FIG. 10A at section 10B, which shows the series of peaks 168 and valleys 170 that run parallel to the corresponding perimeter edges. As shown in FIG. 10B, there is little, if any, gap between the die pad 106 and the mold structure 148 at the bottom surface 132 of the die pad. This is the case because the peaks 168 of the tool markings are coplanar with the bottom surface 132 of the die pad. In an embodiment, the peaks of the tool markings are coplanar with the bottom surface of the die pad if the peaks are within 0.005-0.01 mm of the plane of the bottom surface.

FIG. 10C depicts a side cutaway view of the die pad 106 of FIG. 10A at section 10C at a point that corresponds to the bottom of a valley 170. Because the peaks 168 and valleys 170 all run parallel to each other, the peaks and valleys at the left and right edges of the die pad run perpendicular to the corresponding perimeter edges and parallel to the direction at which mold compound could bleed between the die pad and a mold structure. The perpendicular orientation of the peaks and valleys causes there to be portions of the die pad that are below a plane defined by the top surface 130 of the die pad and above a plane that is defined by the bottom surface 132 of the die pad as indicated by the highlighted locations 180 in FIG. 10C. For example, the valleys may create a gap 182 of between 0.005-0.01 mm between the bottom of a valley 170 and the plane of the corresponding top surface 130 or bottom surface 132 of the die pad 106. As described above with reference to FIGS. 6-8, a gap between the bottom surface of the die pad and the mold structure can allow mold bleeding and ultimately undesired mold flash.

In accordance with an embodiment of the invention, the die pad is planarized such that the tool markings at the perimeter of the die pad have a series of peaks and valleys that run parallel to the perimeter edge of the die pad at all locations around the perimeter edge of the die pad. Orienting the tool markings so that the peaks and valleys run parallel to the perimeter edges at all locations around the perimeter edge inhibits the bleeding of molding compound and ultimately reduces the formation of undesired mold flash at the exposed surface of the die pad.

Figure 11A:
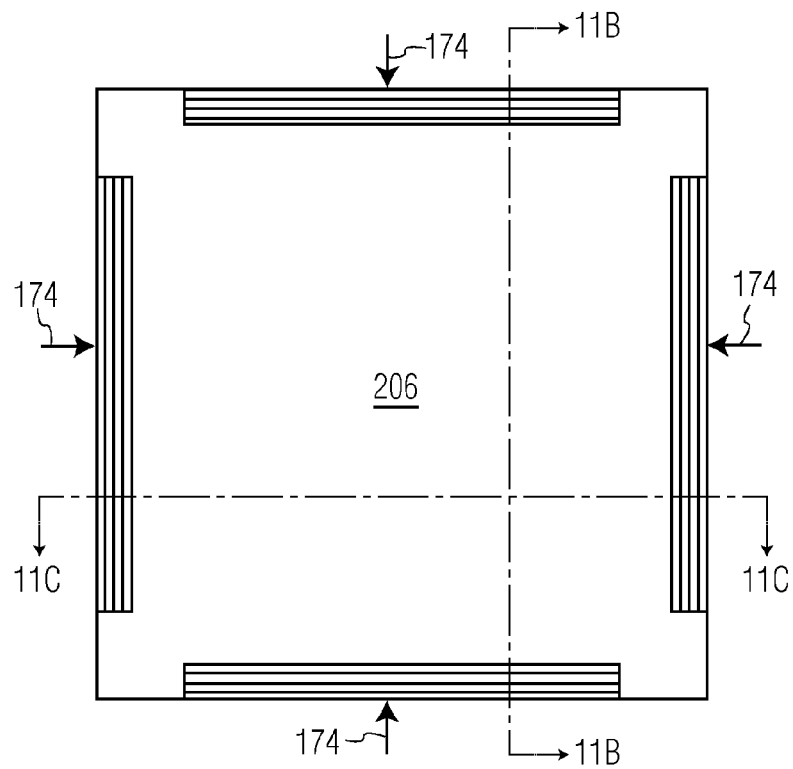
FIGS. 11A-11C depict top and side cutaway views of a die pad having tool markings in which peaks and valleys run parallel to the perimeter edge at all locations around the perimeter edge.
Figure 11B:
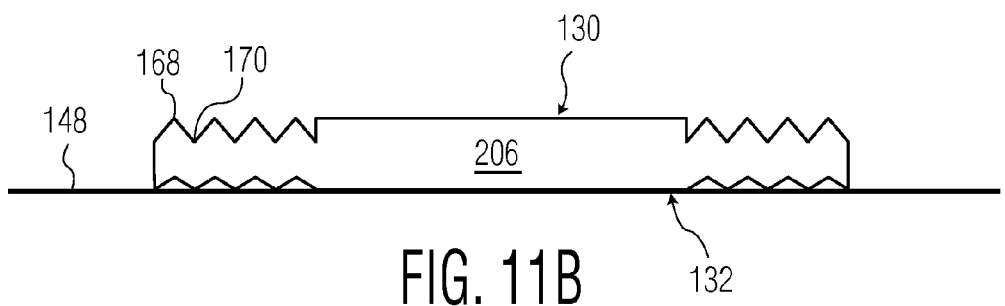
Figure 11C:
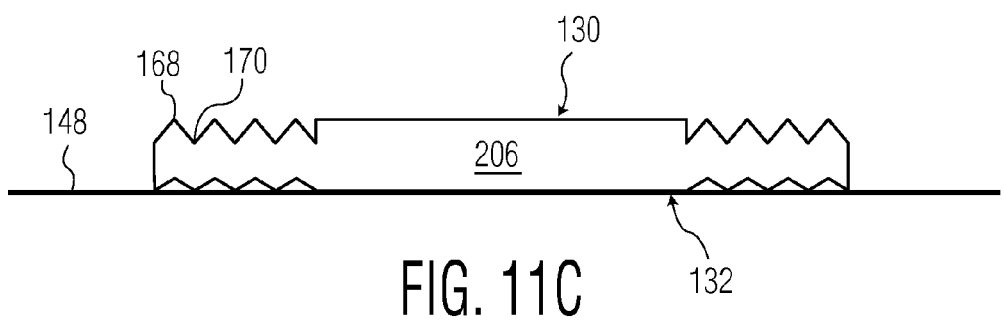

FIGS. 11A-11C depict top and side cutaway views of a die pad 206 having tool markings 166 in which peaks 168 and valleys 170 run parallel to the perimeter edge of the die pad at all locations around the perimeter edge of the die pad. With reference to FIG. 11A, at all four sides of the rectangular die pad 206, the peaks and valleys of the tool markings run parallel to the corresponding edge. FIG. 11B is a side cutaway view of the die pad 206 at section 11B. The side cutaway view of the die pad at section 11B of FIG. 11A looks similar to the side cutaway view of FIG. 10B. That is, because the series of peaks and valleys at the top and bottom perimeter edges run parallel to the corresponding perimeter edges, there will be little if any gap between the bottom surface of the die pad and a mold structure during the mold molding operation. In contrast to the die pad of FIGS. 10A-10C, the die pad of FIGS. 11A-11C does not have any tool markings that run perpendicular to a corresponding perimeter edge resulting in the gaps as shown in FIG. 10C. In an embodiment, the die pad is approximately 5.6 mm×5.6 mm and the tool markings are 4.6 mm long by 0.1 mm wide. In an embodiment, the length of the tool markings should be at least 80% of the length of each side of the die pad and the tool markings are approximately 0.05-0.15 mm wide. In other embodiments, the die pad may be, for example, 4.6 mm×4.6 mm, 6.6 mm×6.6 mm, or 8.6 mm×8.6 mm.

In particular, FIG. 11C is a side cutaway view of the die pad 206 at section 11C, which shows the tool markings in a series of peaks 168 and valleys 170 that run parallel to the corresponding perimeter edges. As shown in FIG. 11C, there is little, if any, gap between the die pad 206 and the mold structure 148 at the bottom surface 132 of the die pad. This is the case because the peaks of the tool markings are coplanar with the bottom surface of the die pad. In an embodiment, the peaks of the tool markings are coplanar with the bottom surface of the die pad if the peaks are within 0.005-0.01 mm of the plane of the bottom surface.

Experimental evaluation of the above described orientation of tool markings has shown that the formation of mold flash can be significantly reduced at the exposed surface of a die pad. For example, it has been found in an embodiment of a die pad that is 5.6 mm×5.6 mm, that the reduction in the formation of mold flash is from approximately 36 to 44%. The reduction in mold flash attributable to the new orientation of tool markings is described with reference to FIGS. 12A-13B.

Figure 12A:
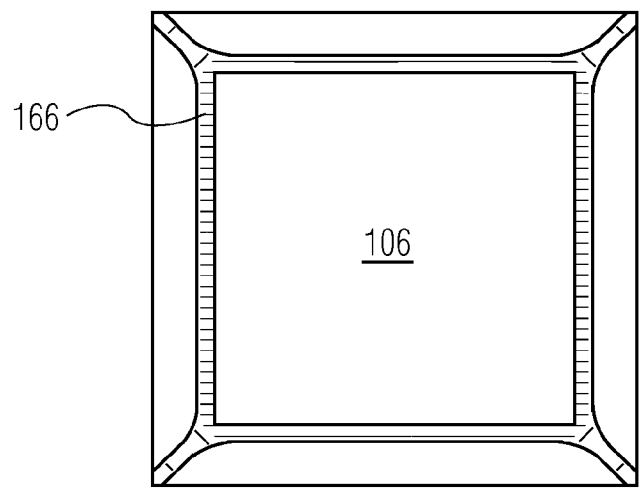
FIGS. 12A and 12B depict a die pad in pre and post molding stages in which the die pad has tool markings oriented in a conventional manner as described with reference to FIGS. 10A-10C.
Figure 12B:
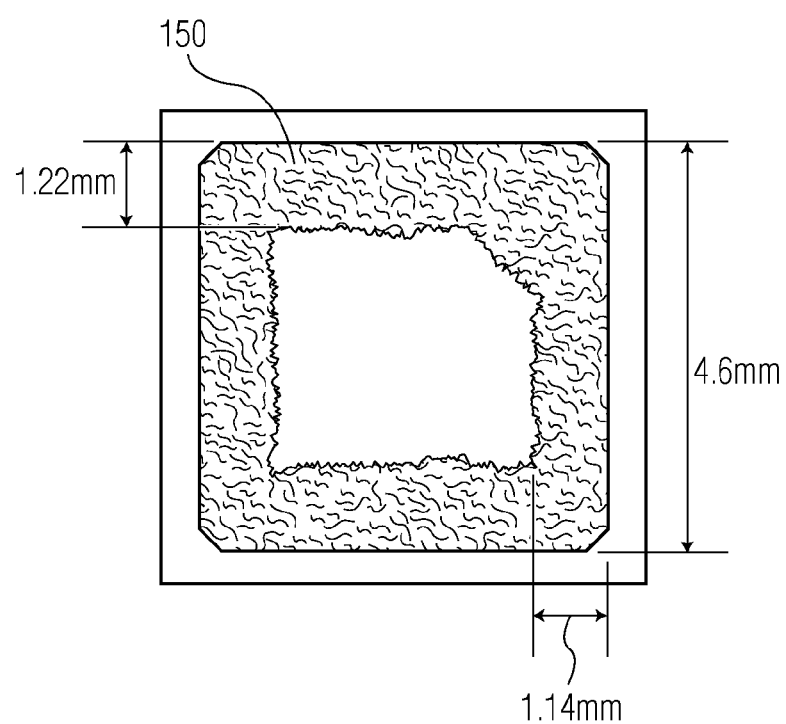

FIG. 12A depicts a die pad 106 with tool markings 166 oriented in a conventional manner as described with reference to FIGS. 10A-10C. In particular, FIG. 12A depicts the backside, bottom side 132, or exposed side of the die pad before the molding process and FIG. 12B depicts the same view of the die pad after the molding process. As shown in FIG. 12B, mold flash 150 has formed at the perimeter of the die pad. In particular, in the vertical direction, mold flash has formed at the top and bottom edges at up to 1.22 mm from the upper edge of the die pad and in the horizontal direction, mold flash has formed at the left and right edges at up to 1.14 mm from the right edge of the die pad. In this case, mold flash is formed on approximately 63% of the total surface area of the exposed die pad.

Figure 13A:
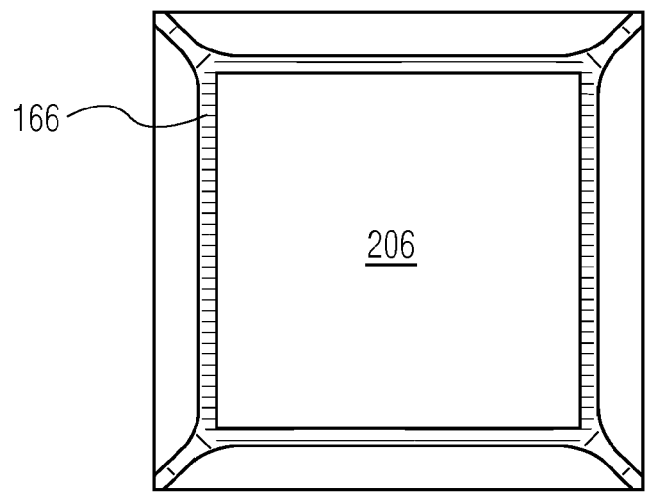
FIGS. 13A and 13B depict a die pad in pre and post molding stages in which the die pad has tool markings oriented in accordance with an embodiment of the invention as described with reference to FIGS. 11A-11C.
Figure 13B:
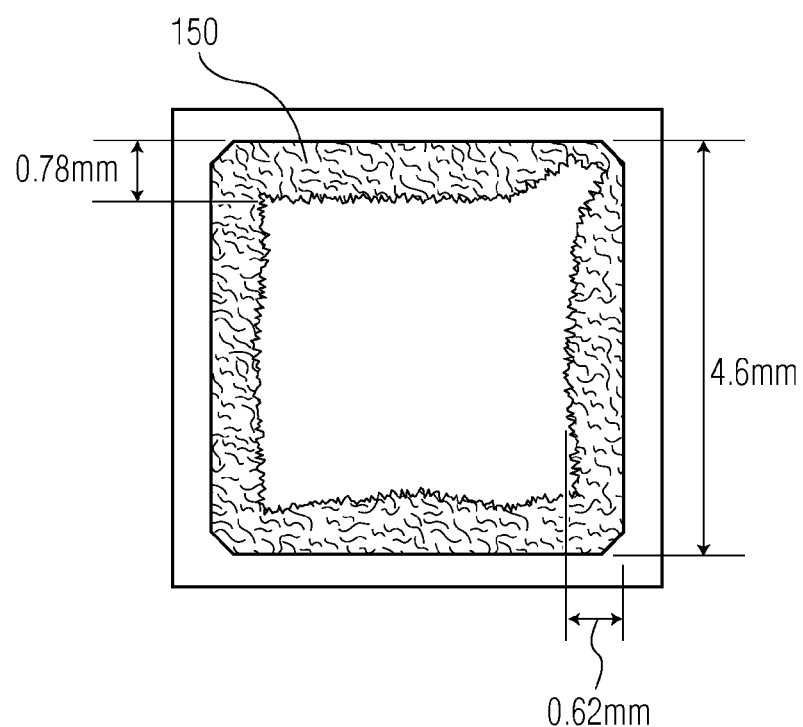

FIG. 13A depicts a die pad 206 with tool markings 166 oriented in accordance with an embodiment of the invention and as described with reference to FIGS. 11A-11C. In particular, FIG. 13A depicts the backside, bottom side 132, or exposed side of the die pad before the molding process and FIG. 13B depicts the same view of the die pad after the molding process. As shown in FIG. 13B, mold flash is still formed at the perimeter edges of the die pad, however, to a much lesser extent than in the case of FIG. 12B. In particular, in the vertical direction, mold flash has formed at the top and bottom edges at up to 0.78 mm from the upper edge of the die pad and mold flash has formed at the left and right edges at up to 0.62 mm from the right edge of the die pad. Comparing the two cases represented in FIGS. 12A-13B, the extent of the mold flash is reduced by up to 36% at the top edge of the die pad and reduced by up to 44% at the right edge of the die pad. Further, the overall surface area coverage of the die pad by mold flash is reduced by up to 44%.

Figure 14:
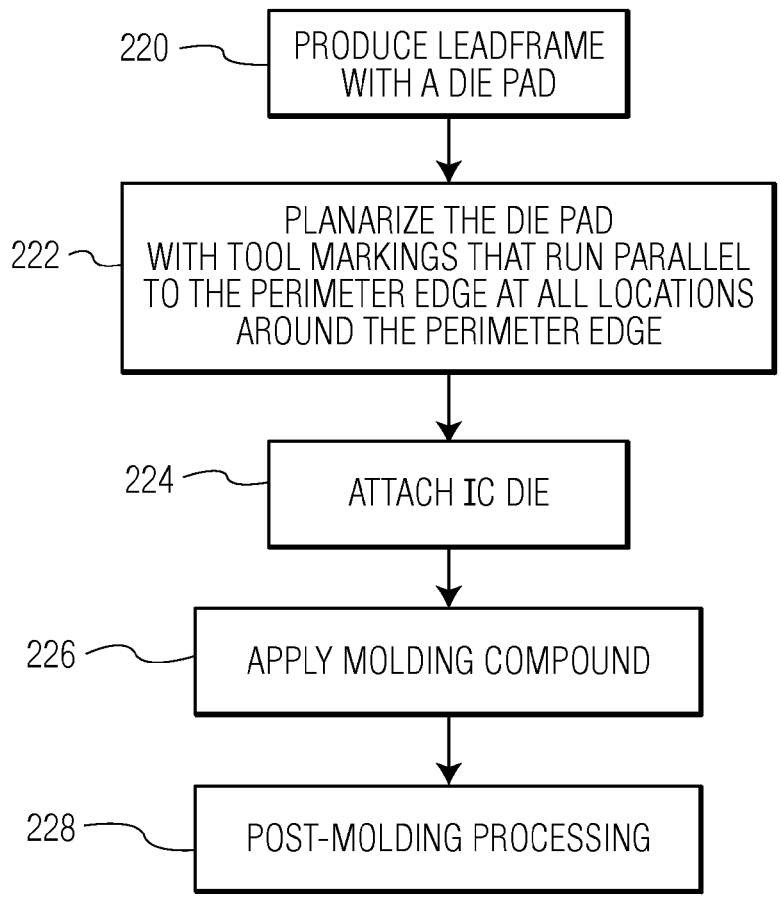
FIG. 14 is a process flow diagram of a method for packaging an IC die in a molded package with an exposed die pad.

FIG. 14 is a process flow diagram of a method for packaging an IC die in a molded package with an exposed die pad. Blocks 220 and 222 represent steps involved in preparing a leadframe for packaging the IC die in a molded package. In particular, at block 220, a leadframe with a die pad is produced. In an embodiment, the die pad has a top surface, a bottom surface, and a perimeter edge. The leadframe can be produced by stamping the leadframe structure from a sheet of conductive material. As described above, the stamping may leave the die pad with burrs that can exacerbate the formation of mold flash. At block 222, the die pad is planarized to flatten the burrs. In particular, the planarization involves spanking the die pad, which embeds tool markings in the die pad at the perimeter edge of the die pad, with the tool markings including a series of peaks and valleys that run parallel to the perimeter edge at all locations around the perimeter edge. Once the leadframe is prepared for IC packaging, at block 224, an IC die is attached to the die pad at the top surface of the die pad. For example, the die pad is attached by an epoxy adhesive. At block 226, a molding compound is applied to the die and a portion of the leadframe to encapsulate the die and the portion of the leadframe. In an embodiment, the molding compound is put into a viscous state by heating and then the viscous molding compound is injected into a mold structure within which the leadframe and IC die sits. In an embodiment, portions of the conductive leads are encapsulated by the molding compound and portions of the conductive leads remain exposed to the outside environment. Exposed leads and the corresponding molding compound are depicted in FIGS. 4A-4E. Once the molding compound is applied, at block 228, various post-molding processing occurs. For example, post-molding processing operations include mold curing, conductive lead plating, and device singulation. The post-molding processing operations are similar to, or the same as, those which are performed with a conventional leadframe as described above with reference to FIGS. 10A-10C, 12A, and 12B.

Figure 15:
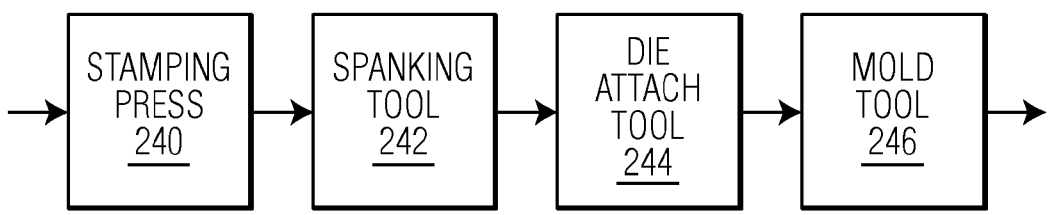
FIG. 15 illustrates a portion of a process flow for packaging and IC device relative to the tools and/or equipment that are used to perform the operations of the packaging process.

The operations described with reference to FIG. 14 are typically performed using tools and/or equipment. FIG. 15 illustrates a portion of a process flow for packaging and IC device relative to the tools and/or equipment that are used to perform the operations of the packaging process. A stamping press 240 is used to stamp leadframe modules out of a sheet of conductive material. For example, the stamping press is used to produce a leadframe strip as shown in FIG. 1. After the leadframe is produced, a spanking tool 242 is used to planarize the die pad. In an embodiment, the spanking tool includes at least one spanking die and at least one spanking punch as described with reference to FIGS. 9A and 9B. The spanking tool can be configured to planarize the die pad, and thereby embed the tool markings, by spanking all four perimeter sides of the die pad simultaneously. In another embodiment, the spanking tool is configured to spank only two sides at a time, e.g., two opposite perimeter sides simultaneously. In still another embodiment, the spanking tool is configured to spank only one perimeter side at a time.

A die attach tool 244 is used to attach the IC dies to the die pads of a leadframe strip. Die attach operations are known in the field of IC device packaging. A mold tool 246 is used to apply the mold to the leadframe module and attached IC die. The mold tool includes a mold structure to form each mold around the leadframe and a molding compound delivery system to deliver viscous molding compound to the mold structure. In an embodiment, the mold tool is configured to apply molding to multiple leadframe modules in parallel as is known in the field. Various post-molding tools (not shown) are used to implement post-molding processing such as curing, plating, and/or singulation.

Although the features embedded by the spanking tool are a series of peaks and valleys, the features embedded by the spanking tool could be other features that have directional characteristics that affect the formation of mold flash. For example, physical features of the tool markings that inhibit mold flow bleeding onto the exposed die pad.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for preparing a leadframe for integrated circuit (IC) die packaging in a molded package with an exposed die pad, the method comprising:
   producing a leadframe with a die pad, wherein the die pad has a top surface, a bottom surface, and a perimeter edge; and
   planarizing the die pad to flatten burrs that may exist at the perimeter edge of the die pad, wherein planarizing the die pad comprises embedding tool markings in the die pad at the perimeter edge of the die pad, the tool markings including a series of peaks and valleys that run parallel to the perimeter edge at all locations around the perimeter edge.

2. The method of claim 1, wherein planarizing the die pad comprises spanking the die pad between a spanking die and a spanking punch, wherein the spanking die and the spanking punch have features that embed the peaks and valleys at the perimeter edge of the die pad.

3. The method of claim 1, wherein the peaks in the die pad are coplanar with the bottom surface of the die pad.

4. The method of claim 1, wherein the die pad is rectangular in shape and wherein the peaks and valleys run parallel to the four sides of the die pad.

5. The method of claim 4, wherein the tool markings are embedded in the die pad one side at time.

6. The method of claim 4, wherein the tool markings are embedded in the die pad two sides at time, with the two sides being opposite each other.

7. The method of claim 4, wherein the tool markings are embedded in the die pad on all four sides simultaneously.

8. The method of claim 1, wherein the tool markings are approximately 0.05-0.15 millimeters wide at the perimeter edge of the die pad.

9. The method of claim 1 further comprising:
   attaching an IC die to the top surface of the die pad; and
   applying a mold compound to encapsulate the die and a portion of the leadframe, excluding the bottom surface of the die pad.

10. A method for preparing a leadframe for integrated circuit (IC) die packaging in a molded package with an exposed die pad, the method comprising:

producing a leadframe with a die pad, wherein the die pad is rectangular in shape and has a top surface, a bottom surface, and four perimeter edges;

planarizing the die pad to flatten burrs that may exist at the four perimeter edges of the die pad, wherein planarizing the die pad comprises embedding tool markings in the die pad at the four perimeter edges of the die pad, wherein the tool markings at each perimeter edge include a series of peaks and valleys that run parallel to the respective perimeter edge.

11. The method of claim 10, wherein planarizing the die pad comprises spanking the die pad between a spanking die and a spanking punch, wherein the spanking die and the spanking punch have features that embed the peaks and valleys at the four perimeter edges of the die pad.

12. The method of claim 10, wherein the peaks at the bottom surface of the die pad are coplanar with the bottom surface of the die pad.

13. The method of claim 10, wherein the tool markings are embedded in the top surface and in the bottom surface of the die pad.

14. The method of claim 10 further comprising:

attaching an IC die to the top surface of the die pad; and applying a mold compound to encapsulate the die and a portion of the leadframe, excluding the bottom surface of the die pad.

15. A leadframe for integrated circuit (IC) die packaging in a molded package, the leadframe comprising:

a die pad having a top surface, a bottom surface, and a perimeter edge; and conductive leads surrounding the die pad;

wherein the die pad comprises tool markings in the die pad at the perimeter edge of the die pad, the tool markings having a series of peaks and valleys that run parallel to the perimeter edge at all locations around the perimeter edge.

16. The leadframe of claim 15, wherein the tool markings are embedded in the die pad during a planarizing operation.

17. The leadframe of claim 15, wherein the peaks in the die pad are coplanar with the bottom surface of the die pad.

18. The leadframe of claim 15, wherein the die pad is rectangular in shape and wherein the peaks and valleys run parallel to the four sides of the die pad.

19. The leadframe of claim 15, wherein the tool markings are approximately 0.05-0.15 millimeters wide at the four perimeter edges of the die pad.

* * * * *